United States Patent
Park et al.

(10) Patent No.: US 7,631,241 B2
(45) Date of Patent: *Dec. 8, 2009

(54) APPARATUS AND METHOD FOR DECODING LOW DENSITY PARITY CHECK CODES

(75) Inventors: Sung-Jin Park, Seoul (KR); Min-Goo Kim, Yongin-si (KR); Nam Yul Yu, Suwon-si (KR); Han-Ju Kim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 486 days.

This patent is subject to a terminal disclaimer.

(21) Appl. No.: 11/133,287

(22) Filed: May 20, 2005

(65) Prior Publication Data

US 2005/0262420 A1 Nov. 24, 2005

(30) Foreign Application Priority Data

May 21, 2004 (KR) .................. 10-2004-0036415

(51) Int. Cl.
*H03M 13/00* (2006.01)
(52) U.S. Cl. .................. 714/752; 714/758; 713/186
(58) Field of Classification Search .................. 714/752
See application file for complete search history.

(56) References Cited

U.S. PATENT DOCUMENTS 6,823,429 B1 * 11/2004 Olnowich .................. 711/141
6,938,196 B2 * 8/2005 Richardson et al. ......... 714/752
6,957,375 B2 * 10/2005 Richardson .................. 714/752
7,246,304 B2 * 7/2007 Kim .......................... 714/801
7,454,685 B2 * 11/2008 Kim et al. .................... 714/758
2003/0037298 A1 2/2003 Eleftheriou et al.
2003/0065989 A1 * 4/2003 Yedida et al. ................ 714/703
2004/0216024 A1 * 10/2004 Jin et al. ...................... 714/752

FOREIGN PATENT DOCUMENTS

| KR | 1020030095144 | 12/2003 |
| KR | 1020040036460 | 4/2004 |
| KR | 1020040056972 | 7/2004 |

* cited by examiner

*Primary Examiner*—M. Mujtaba K Chaudry
*Assistant Examiner*—Enam Ahmed
(74) *Attorney, Agent, or Firm*—Roylance, Abrams, Berdo & Goodman, L.L.P.

(57) ABSTRACT

An apparatus and method for decoding low density parity check (LDPC) codes are provided. A memory module configured by a plurality of unit memories stores a reliability value. Variable node processors perform a computation associated with a variable node, and update data of the memory module in a column direction, respectively. Check node processors perform a computation associated with a check node, and update data of the memory module in a row direction, respectively. A parity checker determines if all errors have been corrected such that an iterative decoding process is performed. A memory access control module selects a unit memory to be updated by a variable node processor or a check node processor.

10 Claims, 10 Drawing Sheets

APPARATUS AND METHOD FOR DECODING LOW DENSITY PARITY CHECK CODES

PRIORITY

This application claims the benefit under 35 U.S.C. 119(a) of an application entitled "Apparatus and Method for Decoding Low Density Parity Check Codes" filed in the Korean Intellectual Property Office on May 21, 2004 and assigned Serial No. 2004-36415, the entire contents of which are incorporated herein by reference.

BACKGROUND OF THE INVENTION

1. Field of the Invention

The present invention relates generally to a decoding apparatus and method in a communication system. More particularly, the present invention relates to an apparatus and method for decoding low density parity check (LDPC) codes.

2. Description of the Related Art

Conventionally, communication systems do not transmit raw data, but transmit coded data after performing a coding operation. Coding schemes are classified into an iterative coding scheme, a convolution coding scheme, a turbo coding scheme, and a low density parity check (LDPC) coding scheme. Each coding scheme can be used according to its characteristics. A large amount of research is being done on the LDPC coding scheme for use in next generation mobile communication systems.

The LDPC coding scheme is a type of block coding using a coding matrix prior to transmitting information bits. When block coding is performed, the LDPC coding scheme uses a coding matrix including all 1's except for a sparse number of 0's. The LDPC coding scheme uses a parity check matrix configured by rows and columns having a sparse number of 0's. The parity check matrix can be expressed by a code structure using a factor graph in which the rows and columns are mapped to check nodes and variable nodes.

Since their block size is large, LDPC codes have a minimum distance and a low frame error rate as compared with turbo codes. In the case of the LDPC codes, an error floor does not appear at a relatively high signal to noise ratio (SNR). An error detection process can be performed for a decoded codeword and a decoding process can be efficiently stopped, by using the orthogonality of a codeword and a parity check matrix without cyclic redundancy check (CRC).

These LDPC codes can replace turbo codes in the next generation mobile communication system, due to factors such as a parallel structure and low complexity associated with implementation of a decoder, and a low error floor and good frame error rate associated with the performance of a decoder. With continued extensive research into LDPC codes, LDPC codes having excellent characteristics will appear in the future.

Flarion has developed a novel LDPC code design and hardware (H/W) implementation, and has proposed multi-edge type vector LDPC codes that can have an excellent frame error rate as compared with turbo codes in terms of a relatively short length and can implement a parallel structure decoder. The LDPC implementation is focused on an efficient memory design and decoding rate improvement.

FIGS. 1A and 1B illustrate a conventional propagation decoding scheme that is a type of sum product algorithm.

Referring to FIG. 1A, one check node processor is connected to a plurality of variable node processors. The connection between the check node processor and the variable node processors has a parity check matrix structure. A variable node processor is a node to which an initially received symbol is input.

Received symbols are first stored in memories coupled to inputs of the variable node processors. The check node processor computes a probability value of a current node symbol from neighboring probability values after reading probability values that are output from the variable node processors and are stored in the memories. A probability value of a symbol computed by the check node processor is overwritten to a memory.

The variable node processor reads a probability value from a memory to compute the last soft metric (or log-likelihood ratio (LLR)), and stores the computed soft metric in the memory. An iterative computation process between the check and variable node processors is performed such that reliability is improved. Each of the check and variable node processors reads a value from a memory block corresponding to 1 in columns and rows of the parity check matrix, performs a predetermined computation, and stores a computation result.

Referring to FIG. 1B, one variable node processor is connected to a plurality of check node processors. The connection between each check node processor and the variable node processor has a parity check matrix structure.

A memory block is provided such that a memory storing a reliability value of a symbol in each node can be easily configured by hardware. Numbers illustrated in FIGS. 1A and 1B denote different nodes, and an arrow direction denotes the flow of a probability value associated with a reliability value.

FIG. 2 illustrates a conventional parity check matrix and a Tanner graph corresponding thereto.

A parity check matrix H associated with a conventional block code is configured by a large number of 1's. In this matrix, the number of 1's is large. Accordingly, a decoding process can be performed with high reliability. In the case of an iterative decoding structure, desired performance can be obtained through a small number of iterative decoding processes. Here, a '1' value indicates a node connection. Accordingly, when the number of 1's is large, it indicates that a large amount of referable information is present. In this case, an accurate symbol value can be determined. If the number of nodes is large when a determination is made as to whether a symbol is 1 or 0, an accurate probability value can be computed.

Referring to FIG. 2, one check node processor is connected to six variable node processors. However, as the number of nodes increases, the amount of hardware must increase and hence implementation complexity increases in limited applications such as mobile communication.

When node processors are implemented in a non-parallel structure, an LDPC decoder does not have lower complexity than a turbo decoder. In this case, a decoding rate becomes low. Because one check node processor and variable node processors must compute probability values of all received symbols, significant time is required to compute the probability values. However, when the node processors are designed such that they are implemented in a parallel structure to complete all computations at the same time, complexity becomes high. Accordingly, a trade-off is required in applying the parallel structure to a specific system. That is, a suitable parallel structure between the node processors reduces complexity, but degrades the decoding rate. When the LDPC decoder is designed in a partial parallel structure rather than a total parallel structure, control of a memory block becomes complex. A need exists for efficient memory control in a trade-off process between hardware performance and implementation complexity.

SUMMARY OF THE INVENTION

Accordingly, the present invention has been designed to solve the above and other problems occurring in the prior art. Therefore, it is an aspect of the present invention to provide a decoding apparatus and method based on a memory structure that can improve an operating rate and complexity in a low density parity check (LDPC) design.

The above and other aspects of the present invention can be achieved by an apparatus for decoding low density parity check (LDPC) codes. The apparatus comprises a plurality of variable node processors each reading data stored in a memory module in a column direction, computing a probability value of a variable node, and storing the computed probability value in the memory module in the column direction. The apparatus also comprises a plurality of check node processors each reading data stored in the memory module in a row direction, computing a probability value of a check node, and storing the computed probability value in the memory module in the row direction; a parity checker connected to the plurality of check node processors for receiving data from the plurality of check node processors, and determining if a decoding process is successful. The apparatus further comprises the memory module for storing a hard decision bit and a soft metric value in an identical memory address after a computation of each check node processor is performed, the memory module being configured by a plurality of unit memories to be accessed by the plurality of variable node processors and the plurality of check node processors; and a memory access control module for generating an enable signal and a memory address signal for storing the hard decision bit and the soft metric value after a computation of each variable node processor is performed.

The above and other aspects of the present invention can also be achieved by a method for decoding low density parity check (LDPC) codes. The method comprises the steps of initializing memories and registers to zero; storing received symbols in the memories; performing a computation of at least one check node processor in a row direction, and storing a hard decision bit and a soft metric value in an identical memory address; determining if a decoding process is successful, and performing a parity check operation using the hard decision bit; and performing a computation of at least one variable node processor if the decoding process is successful.

BRIEF DESCRIPTION OF THE DRAWINGS

The above and other aspects and advantages of the present invention will be more clearly understood from the following detailed description taken in conjunction with the accompanying drawings, in which.

Throughout the drawings, the same or similar elements are denoted by the same reference numerals.

DETAILED DESCRIPTION OF EXEMPLARY EMBODIMENTS

Embodiments of the present invention will be described in detail herein below with reference to the accompanying drawings. In the following description, a detailed description of known functions and configurations incorporated herein will be omitted for conciseness.

The present invention provides technology for efficiently controlling a memory module to increase a decoding rate and reduce hardware complexity for a parallel structure of node processors in a decoding apparatus and method based on a low density parity check (LDPC) code scheme.

To implement the technology provided by the present invention, a LDPC decoding apparatus will be described with reference to FIG. 3. Hereinafter, the term 'data' indicates a probability value of a received symbol or decoded value.

Figure 1A:
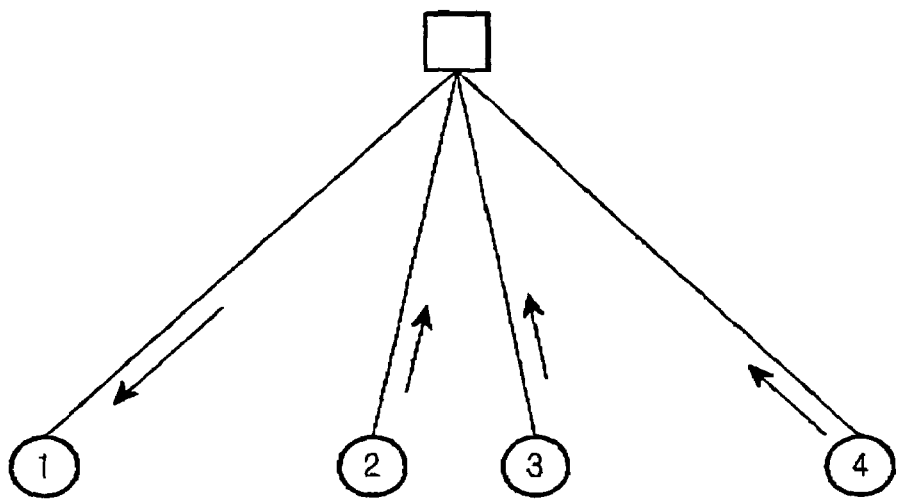
FIGS. 1A and 1B illustrate a conventional belief propagation decoding scheme.
Figure 1B:
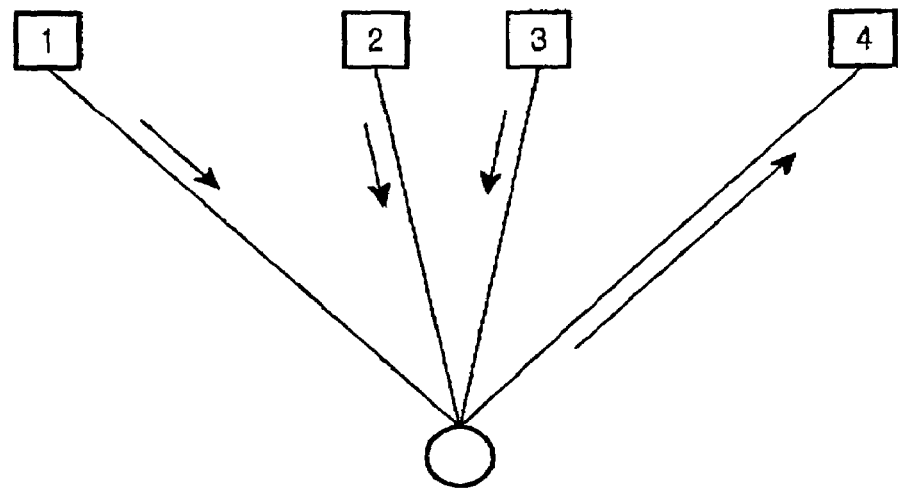
Figure 2:
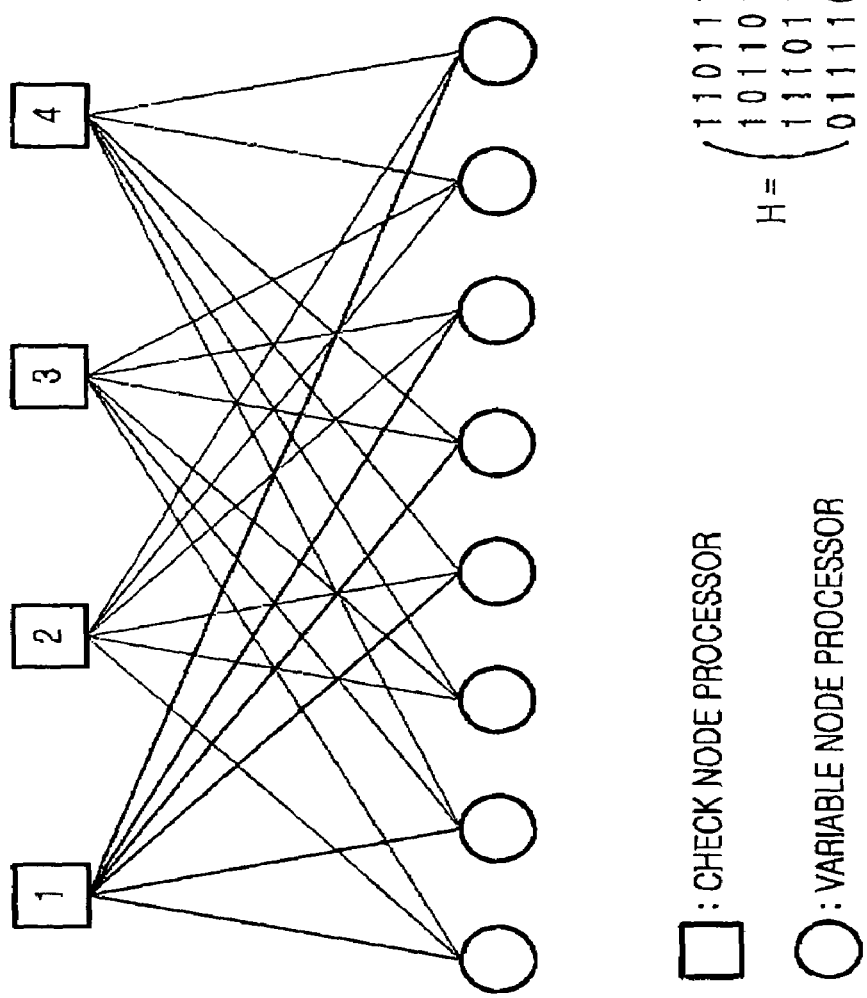
FIG. 2 illustrates a conventional parity check matrix and a Tanner graph corresponding thereto.
Figure 3:
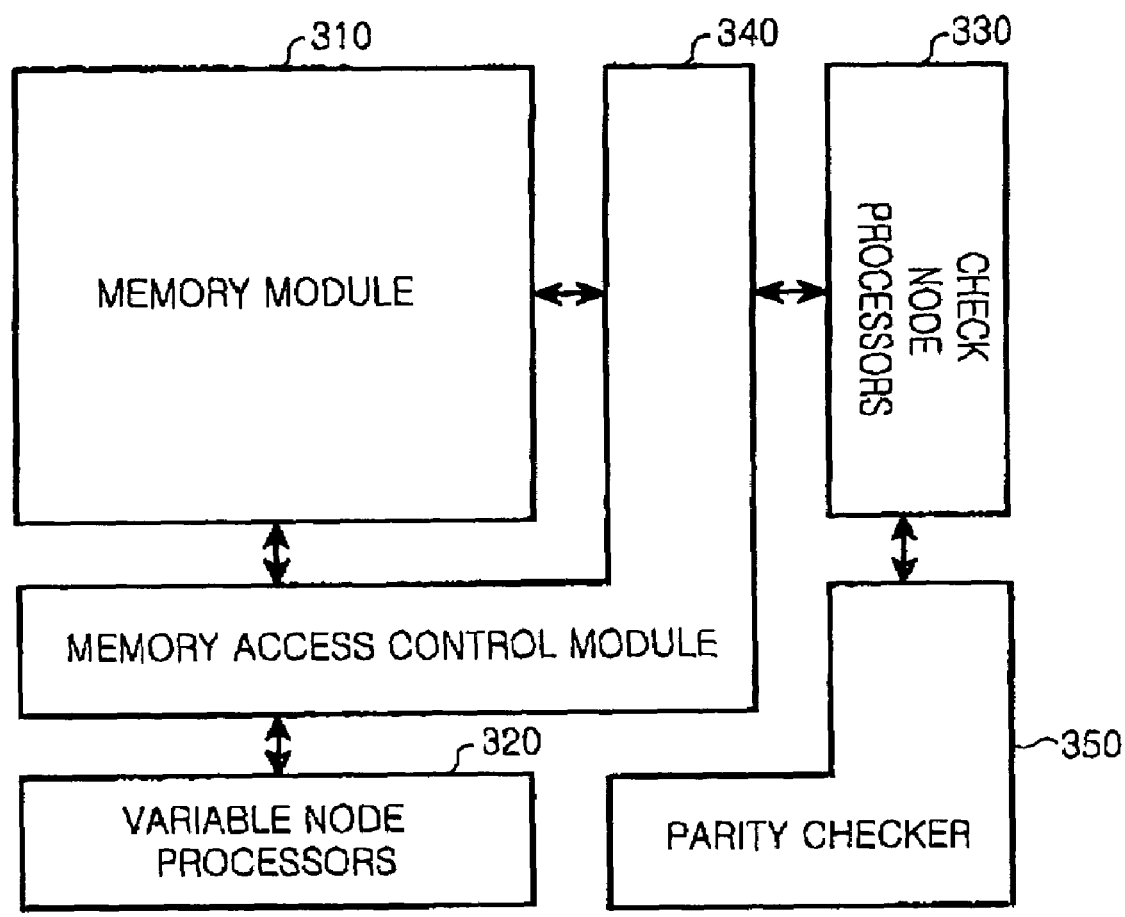
FIG. 3 is a block diagram illustrating a low density parity check (LDPC) decoder in accordance with an embodiment of the present invention.

FIG. 3 is a block diagram illustrating a LDPC decoder in accordance with an embodiment of the present invention. In FIG. 3, a memory module 310 stores a reliability value corresponding to a probability value of a codeword, and stores data input from check code processors 330 and variable node processors 320 according to a control operation of a memory access control module 340. The memory module 310 outputs stored data in response to a request from a check node processor 330 or a variable node processor 320.

The variable node processor 320 reads data stored in the memory module 310, computes a probability value associated with a variable node, and writes the probability value to the memory module 310. The variable node has a probability value. The probability value of the variable node is stored in a memory. The variable node processors 320 read probability values from connection nodes, and compute new probability values.

The check node processor 330 reads probability data of a node from the memory module 310, performs a computation associated with a check node, and writes a computation result to the memory module 310.

In this embodiment of the present invention, the LDPC decoder is implemented in a parallel structure, and has a structure in which the entire memory module 310 is divided into a plurality of unit memories. Because memory address values are different when processors perform a read or write operation, the unit memories are classified into column and row memories according to the number of check node processors or variable node processors, such that a computation can be performed at high speed. Details of the memory module 310 and the node processors 320 or 340 for performing a parallel computation will be described with reference to FIG. 4.

Figure 4:
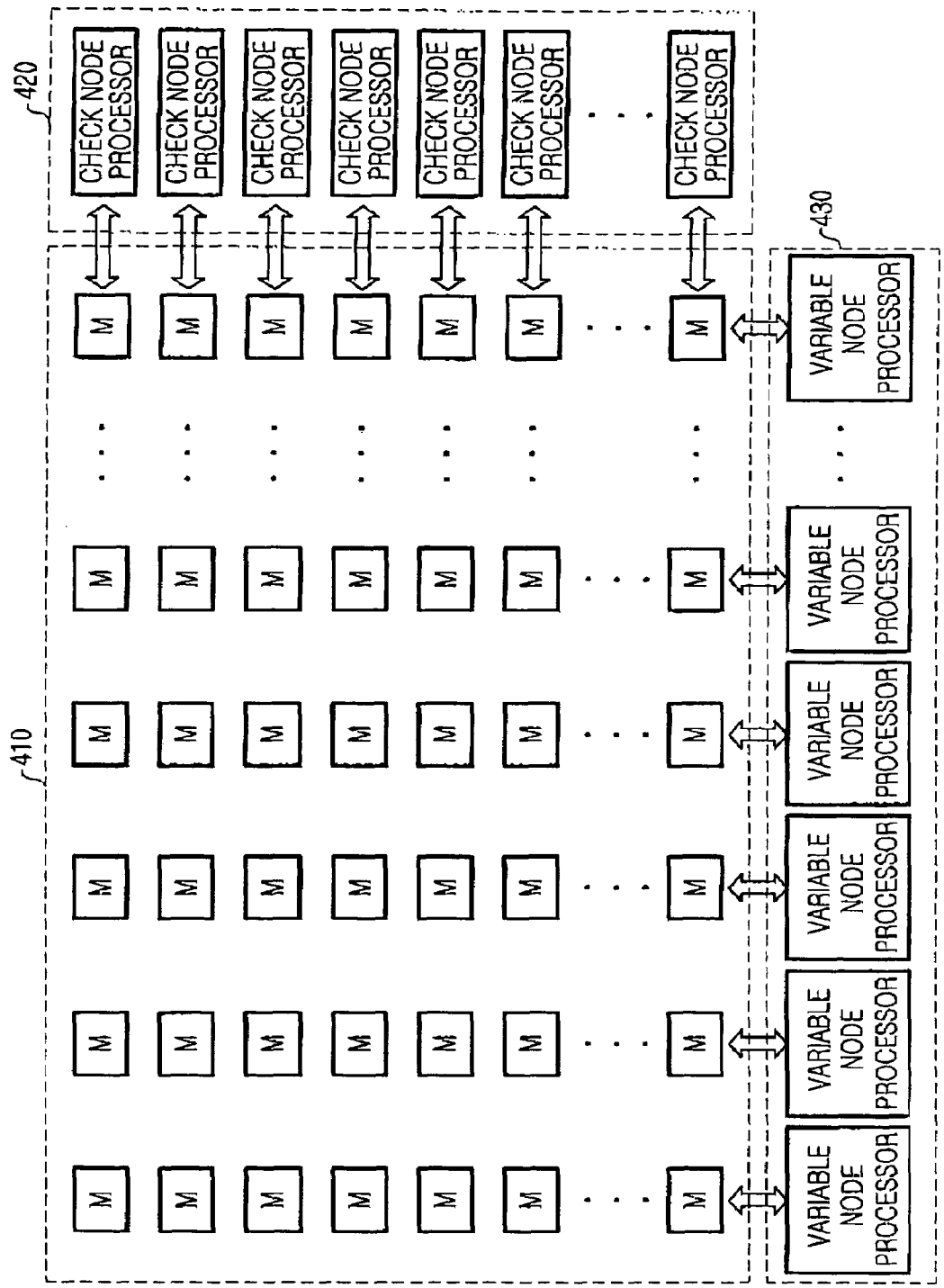
FIG. 4 is a block diagram illustrating a structure of memories and node processors in accordance with an embodiment of the present invention.

FIG. 4 illustrates a plurality of unit memories 410 denoted by 'M', and a plurality of node processors 420 and 430 for accessing the plurality of unit memories 410.

There is a merit in that a decoding rate increases as the number of node processors 420 or 430 increases. However, there is a drawback in that hardware complexity increases due to the increased number of node processors 420 or 430. As described above, this embodiment of the present invention limits the number of node processors 420 or 430 to a preset value, and enables the node processors 420 or 430 to perform different memory computations, because the number of node processors is less than the number of memories storing probability values of nodes and data of all memories cannot be computed at the same time. Accordingly, the node processors read content from all memories through many read operations, perform computations, and store computation results in the memories. That is, if the required number of node processors is 15 and the available number of node processors is 5, each node processor must perform three iterative computations.

As described above, because each memory and each processor are not mapped in a one-to-one relationship, memories to be accessed must be selected such that a limited number of node processors can perform computations for all the memories.

Figure 5:
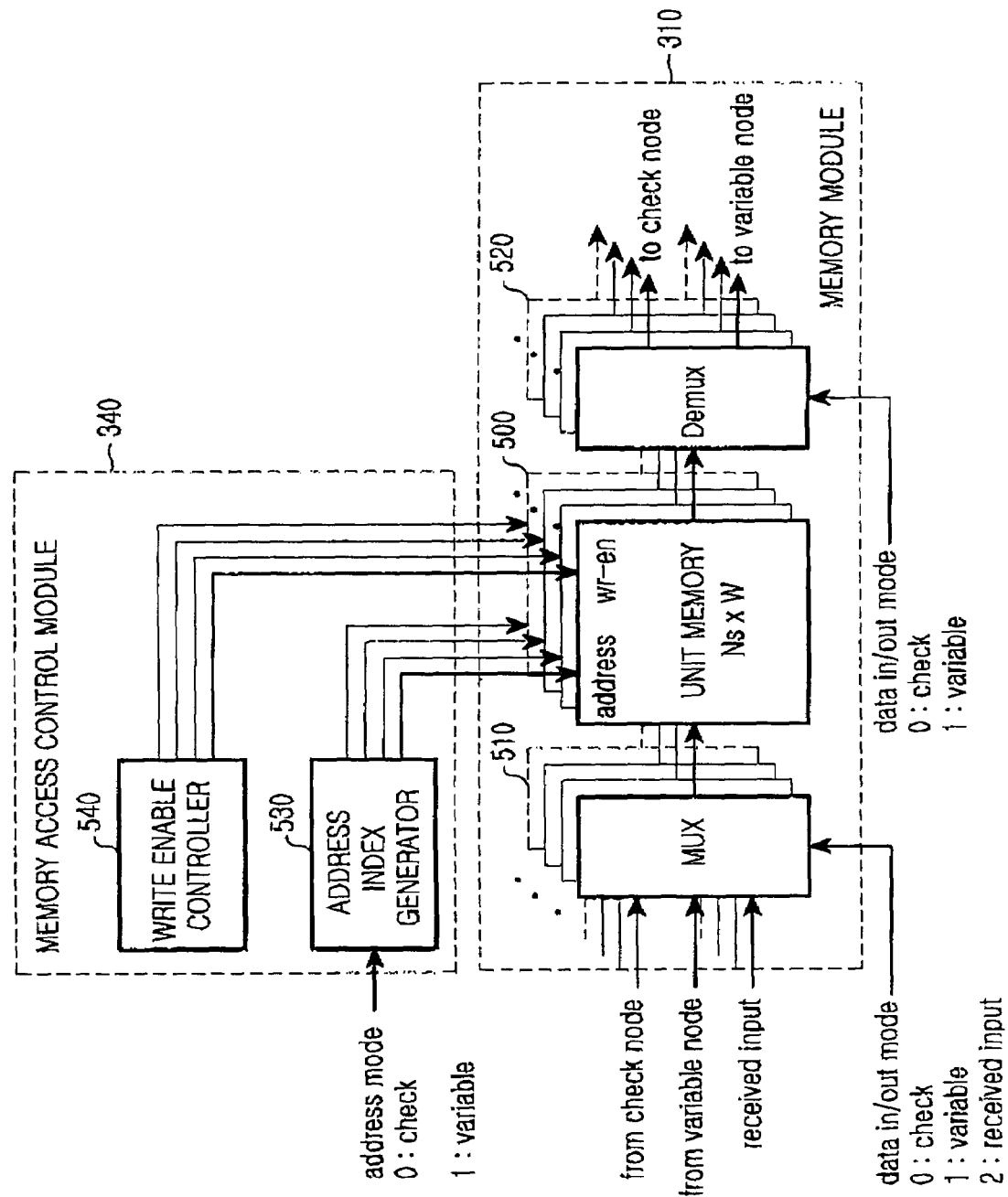
FIG. 5 is a block diagram illustrating a structure for accessing unit memories in accordance with an embodiment of the present invention.

The memory access control module 340 as illustrated in FIG. 3 comprises an address index generator 530 for determining a node processor for accessing a unit memory, and a write enable controller 540 for controlling an operation for enabling a specific unit memory of the plurality of unit memories 410 as illustrated in FIG. 4 and FIG. 5. That is, because multiple values must be read from memories, an address of each memory is input independently, and also a write enable signal is input independently. The write enable controller 540 is required to perform computations for all nodes by using several node processors.

The memory access control module 340 and the unit memory structure 410 in the case where the number of node processors is limited will be described in more detail with reference to FIG. 5.

In FIG. 5, a unit memory 500 is connected to a multiplexer (MUX) 510 and a demultiplexer (DEMUX) 520, such that an input and output are enabled selectively.

The MUX 510 is coupled to an output of a check node processor, an output of a variable node processor, and a received symbol input. Output data is selected according to a set data input/output mode.

Figure 6A:
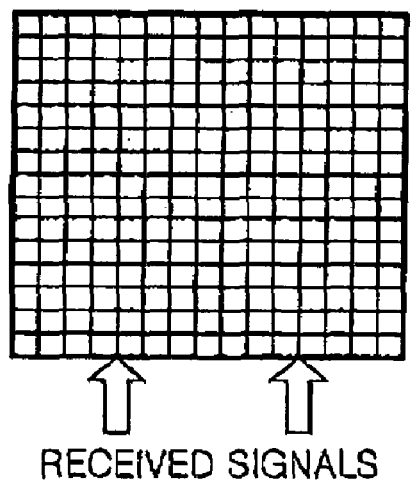
FIGS. 6A to 6D illustrate memory access directions in accordance with an embodiment of the present invention.
Figure 6B:
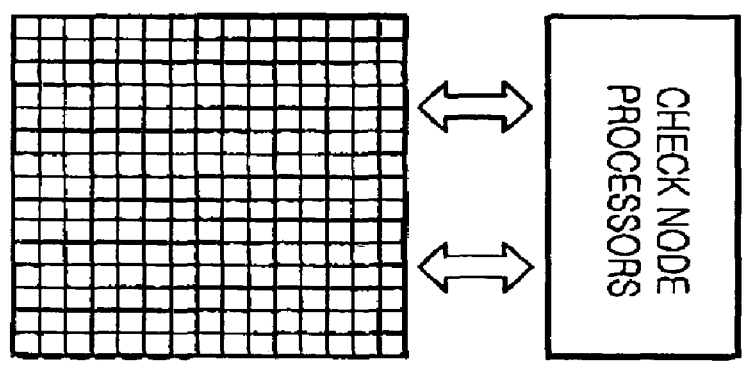

When the data input/output mode is set to 0, data of a check node processor 420 is output to a unit memory 500. An update direction of the check node processor 420 is illustrated in FIG. 6B.

Figure 6C:
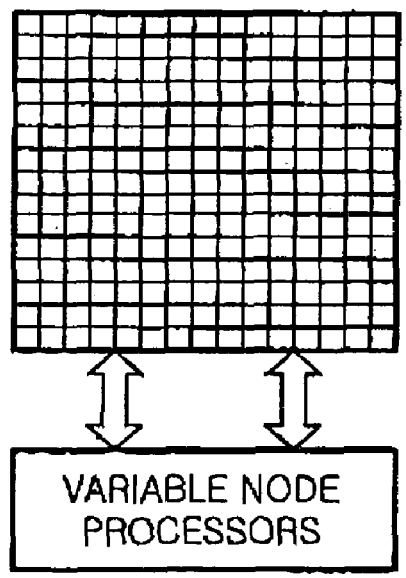

When the data input/output mode is set to 1, data of a variable node processor 430 is output to a unit memory 500. An update direction of the variable node processor 430 is illustrated in FIG. 6C. When the data input/output mode is set to 2, a received symbol stored in a receiver is output to a unit memory 500. As illustrated in FIG. 6A, a received symbol is input in a data update direction of a variable node processor. The received symbol is input in row and column order such that a matrix is exactly computed. The matrix is a parity check matrix or its inverse matrix.

A signal input from a unit memory 500 to a DEMUX 520 is output to a check node processor or a variable node processor. According to a set data input/output mode, an output node is selected. When the data input/output mode is set to 0, data from a unit memory 500 is output to a check node processor 420. When the data input/output mode is set to 1, data form a unit memory 500 is output to a variable node processor 430.

The address index generator 530 generates an address of a unit memory 500. When an address mode is set to 0, an address mapped to a check node processor 420 is generated and output. When an address mode is set to 1, an address mapped to a variable node processor 430 is generated and output. The address index generator 530 outputs, to a unit memory 500, an address mapped to each node processor.

When the LDPC decoder with an iterative decoding structure performs a decoding computation, a parity check operation is always performed in an iterative decoding process. When it is determined that no error is detected in a parity check result, a decoding process is stopped.

Figure 6D:
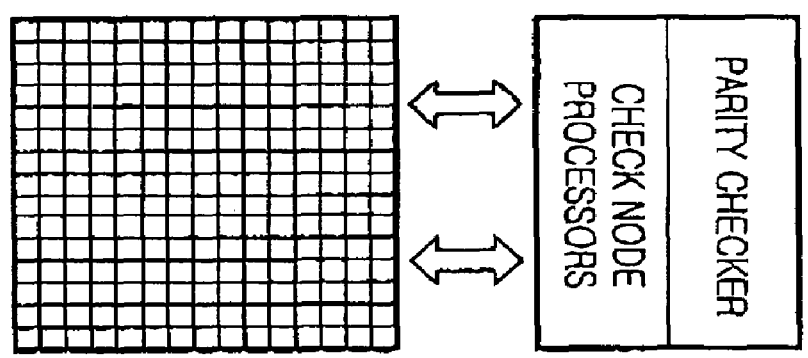

Referring to FIG. 3, a check node processor 330 determines if all errors are corrected, and a parity checker 350 for iterative decoding decision is connected. When the check node processor 330 operates, a parity check operation is performed. FIG. 6D illustrates the case where the parity checker 350 operates when the check node processor 330 performs a computation.

Figure 7:
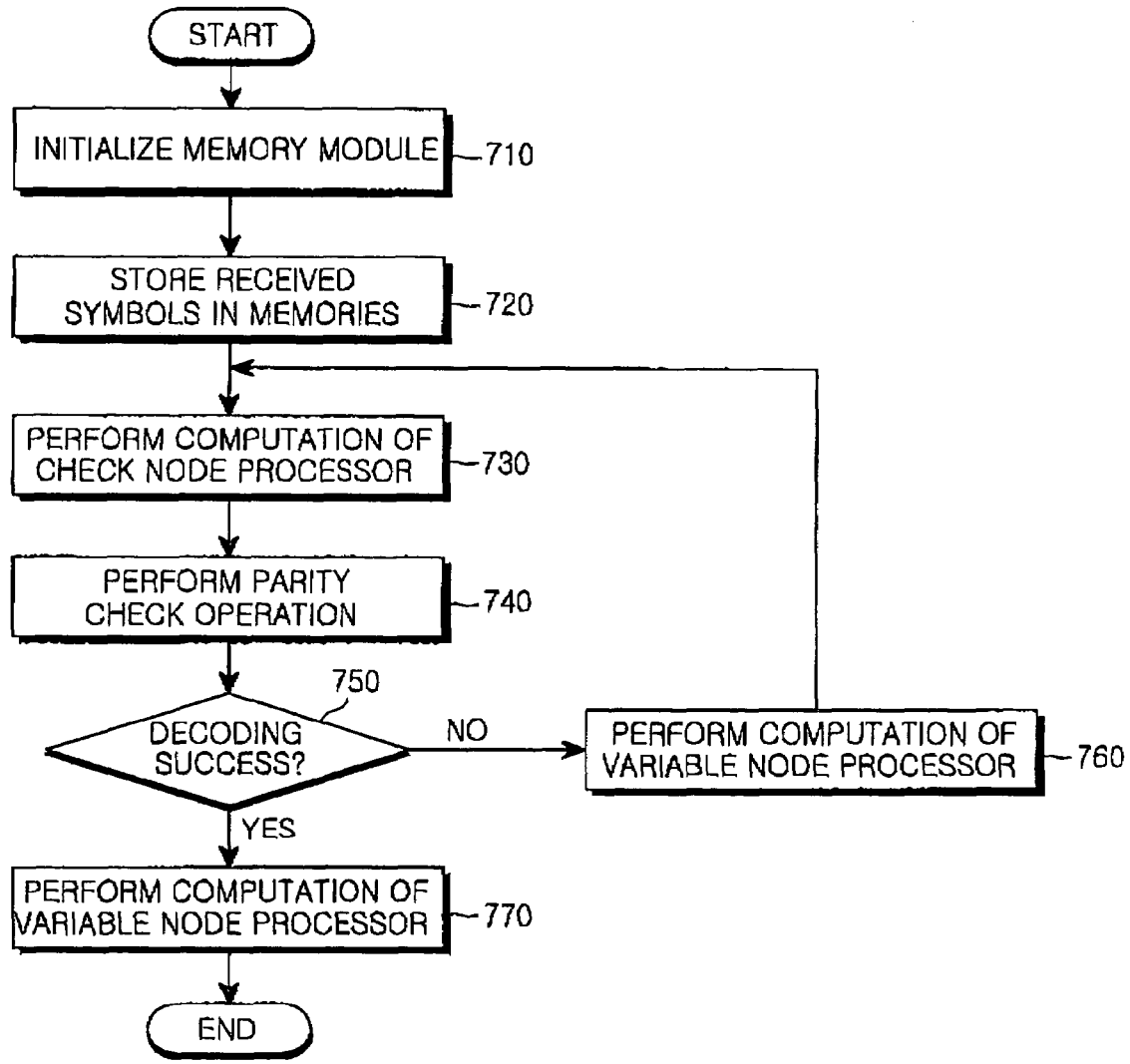
FIG. 7 is a flow chart illustrating an LDPC decoding method in accordance with an embodiment of the present invention.

FIG. 7 is a flow chart illustrating a LDPC decoding method in accordance with an embodiment of the present invention.

Referring to FIG. 7, memories and registers are initialized to 0 in response to a decoding start request signal in step 710. Received symbols are stored in the initialized memories in step 720. In this case, the data input/output mode in the MUX 510 of FIG. 5 is set to 2 as a received signal input mode, and a received signal is output to a unit memory. The address mode of the address index generator 530 is set to 1 as a variable node mode. As illustrated in FIG. 6A, the received signal is input in a direction in which a variable node message is updated, i.e., a column direction, and the decoder also receives an input in the column direction according to transmission information and matrix order.

In step 730, a check node processor 420 reads, from a unit memory 500, a symbol probability value of each node necessary for a computation in a row direction, and performs the computation. In this case, the input/output mode of the DEMUX 520 is set to 0 as a check node mode, and a message stored in the unit memory 500 is output to the check node processor 420. The data input/output mode of the MUX 510 is set to 0 as an input mode for the check node processor 420, a computation result value of the check node processor 420 is stored in the unit memory 500 in a row direction, and the address mode of the address index generator is set to 0 as the check node mode.

Data output to the check node processor 420 is output to the parity checker 350, and a parity check operation is performed in step 740. In step 750, the parity checker 350 determines if a decoding process is successful. If it is determined that the decoding process is unsuccessful in step 750, the variable node processor 430 computes a hard decision value and a soft metric value in step 760, and the procedure returns to step 730. For the computation in step 760, the input/output mode of the DEMUX 520 is set to 1 as the variable node mode, and data of a unit memory is output to the variable node processor 430 in the column direction. After the computation is performed, the data input/output mode of the MUX 510 is set to 1 as the input mode of the variable node processor 430, and data output from the variable node processor 430 is output to the unit memory 500. In this case, the address mode of the address index generator 530 is set to 1 as the variable node mode.

However, if it is determined that the decoding process is successful in step 750, the variable node processor 430 performs a computation in step 770 as in step 760. Then, the variable node processor 430 outputs hard decision information and completes a decoding process. The hard decision information is output to the MUX 510. The variable node processor 430 performs the computation regardless of decoding success because decoding success or failure is determined later. Because the decoding success or failure is determined after the variable node processor 430 completes the computation, time taken to perform an iterative decoding process is reduced when the decoding process fails.

Next, another embodiment of the LDPC decoding method according to an internal structure of the unit memory 500 will be described.

First, the internal structure of the unit memory 500 will be described with reference to FIG. 8.

Figure 8:
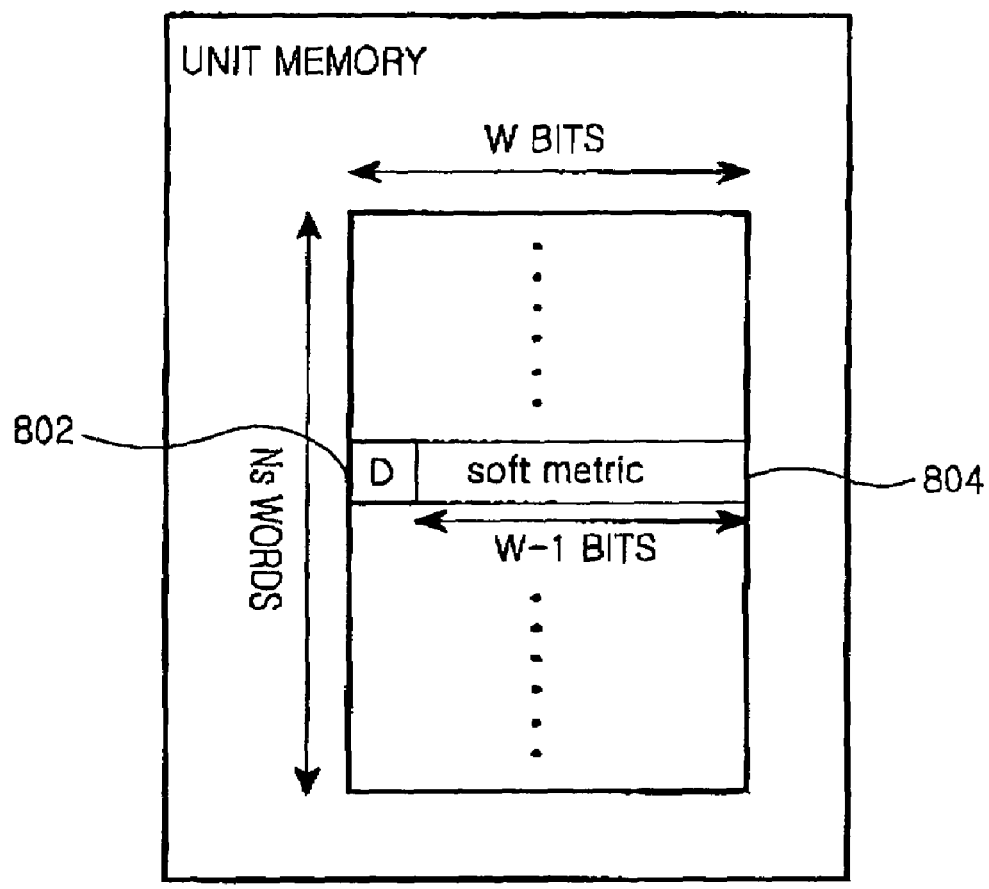
FIG. 8 illustrates an internal structure of a unit memory in accordance with an embodiment of the present invention.

Referring to FIG. 8, a unit memory stores Ns words and has a bit width of W bits. One word includes a hard decision bit 802 as the most significant bit and a soft metric (or log-likelihood ratio (LLR)) value 804 as the remaining bits.

When the LDPC decoder with an iterative decoding structure performs a decoding computation, a parity check operation is always performed in an iterative decoding process. When the parity check operation is performed, a check node processor 420 operates. When the hard decision bit 802 is stored, a variable node processor 430 operates.

After step 730 serving as the first iterative step of FIG. 7 is performed, a message of a check node processor 420 is only stored in a unit memory 500. Accordingly, the unit memory 500 does not contain the hard decision information. When a parity check operation is performed in the first iterative process, the check node processor 420 operates. Complete hard decision information is obtained, after the operations of all check node processors 420 are completed and the operation of the variable node processor 430 is performed.

Figure 9:
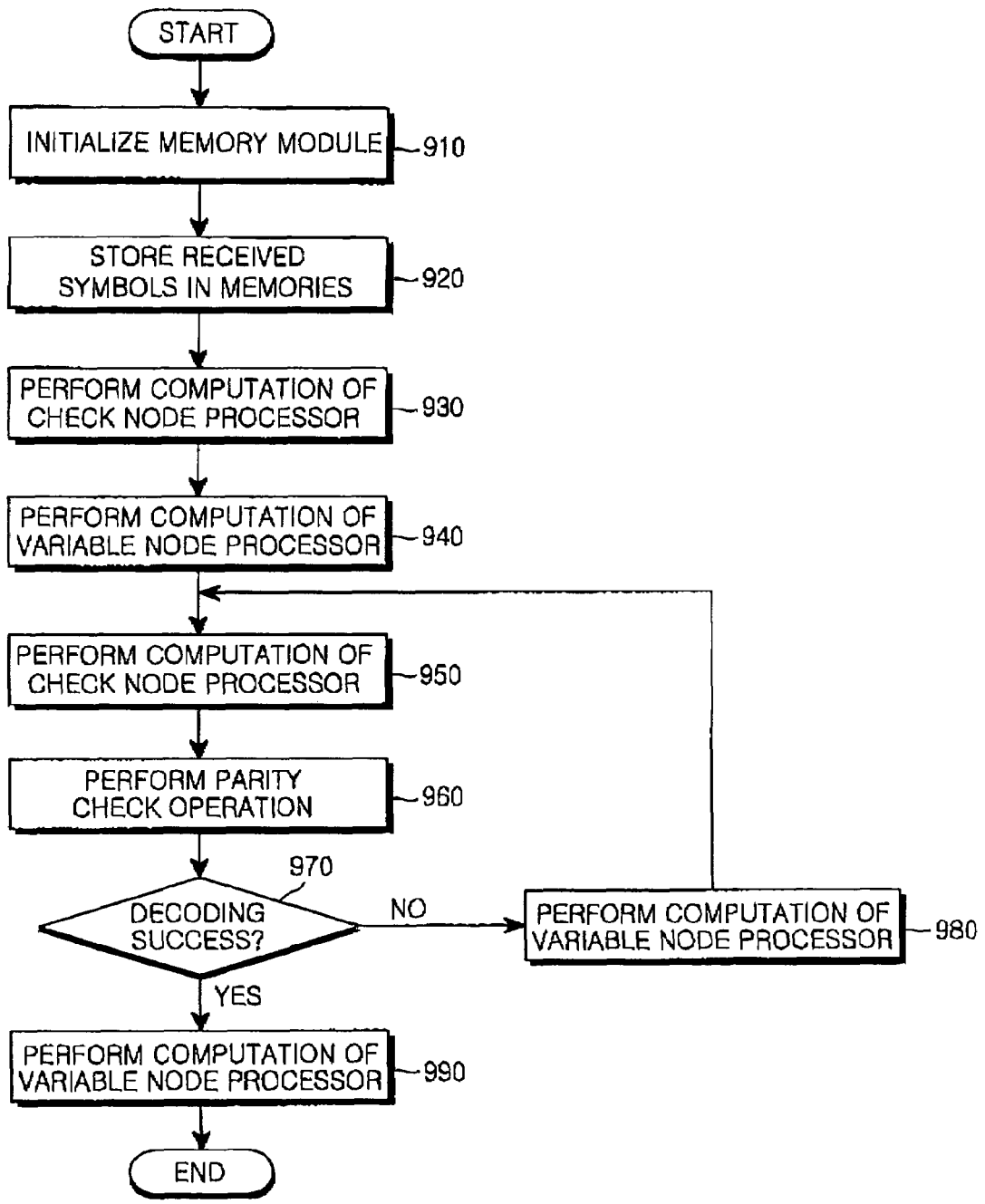
FIG. 9 is a flow chart illustrating an LDPC decoding method in accordance with another embodiment of the present invention.

FIG. 7 illustrates a procedure in which a parity check operation is performed while a computation of a check node processor is performed in step 730. FIG. 9 illustrates a procedure in which a parity check operation is not performed immediately after computations of check and variable node processors are performed in steps 930 and 940.

Accordingly, FIG. 9 additionally comprises steps 930 and 940 as compared with FIG. 7. After the first iterative process is performed without a parity check operation, the parity check operation is performed in the second iterative process in step 950.

After step 940 is performed, it is preferred that the variable node processor obtains hard decision information, and then the obtained hard decision information is stored in a memory in the same address as an address in which a soft metric (LLR) value is stored. The variable node processor computes the hard decision value along with the LLR value, and stores the two values in the memory. When check node processing is performed in step 950, a parity check operation can be performed. That is, because an address of the hard decision bit 802 is the same as an address from which the check node processor 420 reads data, the most significant bit of the memory is input to the parity checker 350, and the remaining bits are input to the check node processor 420. Because the hard decision bit and the soft metric bits are stored in the memory together, read and write operations can be easily performed. A memory word is configured such that the most significant bit is input to the parity checker and the remaining bits are input to the check node processor.

Alternatively, the present invention may additionally perform an iterative decoding process of steps 930 and 940 before step 950 for performing a computation of a check node processor in FIG. 9 different from the FIG. 7.

As is apparent from the above description, the present invention can improve a decoding rate through an efficient memory control operation, and can reduce circuit complexity.

While the invention has been shown and described with reference to certain embodiments thereof, it will be understood by those skilled in the art that various changes in form and details may be made therein without departing from the spirit and scope of the invention as defined by the appended claims.

What is claimed is:

1. An apparatus for decoding low density parity check (LDPC) codes, comprising:
  a plurality of variable node processors each, as part of a decoding process, reading data stored in a unit memory of a memory module in a column direction wherein the unit memory corresponds to the variable node that is being processed and a check node connected to the variable node, computing a probability value of the variable node that is being processed, and storing the computed probability value in the unit memory in the column direction;
  a plurality of check node processors each, as part of the decoding process, reading data stored in a unit memory of the memory module in a row direction wherein the unit memory corresponds to a check node that is being processed and a variable node connected to the check node, computing a probability value of the check node, and storing the computed probability value in the unit memory of the memory module in the row direction;
  a parity checker connected to the plurality of available check node processors for, as part of the decoding process, receiving data from one of the plurality of check node processors and performing a parity check operation, and determining if the decoding process is successful based on a result of the parity check operation;
  the memory module for, as part of the decoding process, storing a hard decision bit and a soft metric value in an identical memory address in a unit memory of the memory module if the decoding process is determined as unsuccessful based on the result of the parity check operation, the memory module being divided into a plurality of unit memories in rows according to a required number of check nodes and in columns according to a required number of variable nodes, each unit memory corresponding to a pair of a check node and a variable node and being accessible by one of the plurality of check node processors in a row direction and by one of the plurality of variable node processors in a column direction, wherein the one check node processor is allocated to process the check node and the one variable node processor is allocated to process the variable node; and
  a memory access control module for, as part of the decoding process, outputting an address of a specific unit memory of the plurality of unit memories and controlling an operation for enabling access to the specific unit memory.

2. The apparatus of claim 1, wherein the memory access control module comprises:
  an address index generator for outputting the address of the unit memory mapped to a pair of a check node processed by one of the plurality of check node processors and a variable node processed by one of the plurality of variable node processors; and
  a write enable controller for controlling an operation for enabling access to the specific unit memory.

3. The apparatus of claim 1, wherein the plurality of unit memories are connected to multiplexers and demultiplexers such that an input and output are enabled selectively.

4. The apparatus of claim 1, wherein the apparatus comprises a low density parity check decoder.

5. The apparatus of claim 4, wherein the LDPC decoder is implemented in a parallel structure.

6. The apparatus of claim 1, wherein the plurality of check node processors determine if all errors are corrected.

7. The apparatus of claim 1, wherein the parity checker performs iterative decoding when the required number of check nodes exceeds the number of the plurality of check node processors or the required number of variable nodes exceed the number of the plurality of variable node processors.

8. A method for decoding low density parity check (LDPC) codes using an apparatus, the apparatus comprising at least a memory module, the memory module being divided into a plurality of unit memories in rows according to a required number of check nodes and in columns according to a required number of variable nodes, each unit memory corresponding to a pair of a check node and a variable node and being accessible by one of a plurality of check node processors in a row direction and by one of a plurality of variable node processors in a column direction wherein the one check node processor is allocated to process the check node and the one variable node processor is allocated to process the variable node, the decoding method comprising, as part of a decoding process, the steps of:

reading, by one of the plurality of check node processors, data stored in a unit memory in a row direction wherein the unit memory corresponds to a check node and a variable node connected to the check node; and computing a probability of the check node, and storing the computed probability value in the unit memory in the row direction, wherein the one check node processor is allocated to process the check node;

performing a parity check operation, and determining if the decoding process is successful based on a result of the parity check operation;

storing a hard decision bit and a soft metric value in an identical memory address in the unit memory if the decoding process is determined as unsuccessful based on the result of the parity check operation; and if the decoding process is determined as successful, reading, by one of the plurality of variable node processors, data stored in the unit memory in a column direction, computing a probability of the variable node, and storing the computed probability value in the unit memory in the column direction, wherein the one variable node processor is allocated to process the variable node.

9. The method of claim 8, further comprising the step of:
performing the computation of the one variable node processor and an iterative computation if the decoding process fails.

10. The method of claim 9, further comprising the step of:
performing an iterative decoding process before the computation of the one check node processor.

* * * * *

UNITED STATES PATENT AND TRADEMARK OFFICE
CERTIFICATE OF CORRECTION

| | |
|---|---|
| PATENT NO. | : 7,631,241 B2 |
| APPLICATION NO. | : 11/133287 |
| DATED | : December 8, 2009 |
| INVENTOR(S) | : Park et al. |

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 787 days.

Signed and Sealed this

Twenty-first Day of December, 2010

David J. Kappos
*Director of the United States Patent and Trademark Office*